United States Patent [19]

Persico

[11] Patent Number: 5,574,755
[45] Date of Patent: Nov. 12, 1996

[54] I/Q QUADRAPHASE MODULATOR CIRCUIT

[75] Inventor: Charles J. Persico, Sunnyvale, Calif.

[73] Assignee: Philips Electronics North America Corporation, New York, N.Y.

[21] Appl. No.: 186,398

[22] Filed: Jan. 25, 1994

[51] Int. Cl.⁶ .............................. H04L 27/04; H03C 3/00
[52] U.S. Cl. ....................... 375/295; 375/261; 375/298; 332/103
[58] Field of Search ................................ 375/261, 298, 375/295; 332/103, 104, 105

[56] References Cited

U.S. PATENT DOCUMENTS

| | | | |
|---|---|---|---|
| 4,766,400 | 8/1988 | Fox | 332/107 |
| 4,908,840 | 3/1990 | Kakimoto | 375/308 |
| 5,012,208 | 4/1991 | Mäkinen et al. | 375/298 |
| 5,231,364 | 7/1993 | Mucke | 375/261 |
| 5,319,675 | 6/1994 | Osaka | 375/59 |
| 5,355,101 | 10/1994 | Ichihara et al. | 375/261 |
| 5,387,883 | 2/1995 | Ueda | 375/261 |
| 5,406,587 | 4/1995 | Horwitz et al. | 375/261 |
| 5,412,351 | 5/1995 | Nystrom et al. | 375/308 |

OTHER PUBLICATIONS

"Silicon Bipolar Monolithic QPSK Modulator", Technical Data, Hewlett Packard.

*Primary Examiner*—Edward L. Coles, Sr.
*Assistant Examiner*—Kimberly A. Williams
*Attorney, Agent, or Firm*—Steven R. Biren

[57] ABSTRACT

An I/Q quadraphase modulator circuit for correcting phase errors of, typically, LO input quadrature signals. The circuit uses a pair of Gilbert cell multipliers, to the bottom ports of which are applied I and Q signals, and to the top ports of which are applied sum and difference, limited, quadrature, differential signals. The result is to make the circuit less sensitive to LO phase errors and thus to improve sideband (image) rejection over the conventional circuit typically using one Gilbert cell multiplier.

8 Claims, 2 Drawing Sheets

I/Q QUADRAPHASE MODULATOR CIRCUIT

This invention relates to I/Q quadraphase modulator electrical circuits.

BACKGROUND OF THE INVENTION

Quadraphase modulator/circuits for digital communication systems are known. For example, the HPMX-2001 is a silicon monolithic quadraphase shift keyed modulator with a typical local oscillator (LO) operating frequency range of DC-2000 MHz and typical I/Q bandwidth of DC-700 MHz. Such devices are useful for, among other things, digital cellular radio, RF data links, vector generators, AM modulators, and single sideband mixers. Typical I/Q modulator performance of this and similar chips is limited by the quadrature quality of the LO signals. Quadrature phase errors occur due to process variations, circuit component mismatch and circuit parasitics. In addition, it is difficult to make accurate broad band quadrature phase shifters. Phase errors in the I and Q LO signals in complex vector modulators, for example, limit sideband suppression critical to meeting system specifications for ADC (IS-54) and GSM digital cellular phone transmitters.

SUMMARY OF THE INVENTION

An object of the invention is a quadraphase modulator circuit having improved performance.

Another object of the invention is a quadraphase modulator circuit which is substantially insensitive to phase errors in the quadrature LO signals.

In accordance with one aspect of the invention, the quadraphase modulator circuit comprises two Gilbert cell type of multipliers each of which comprises top ports and bottom ports. Sum and difference, limited, quadrature, differential signals are applied to the top ports of the Gilbert cell multipliers. The result is to make the circuit less sensitive to LO phase errors and thus to improve sideband (image) rejection over the conventional circuit typically using one Gilbert cell multiplier.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention.

DETAILED DESCRIPTION OF THE PREFERRED EMBODIMENTS

Figure 1:
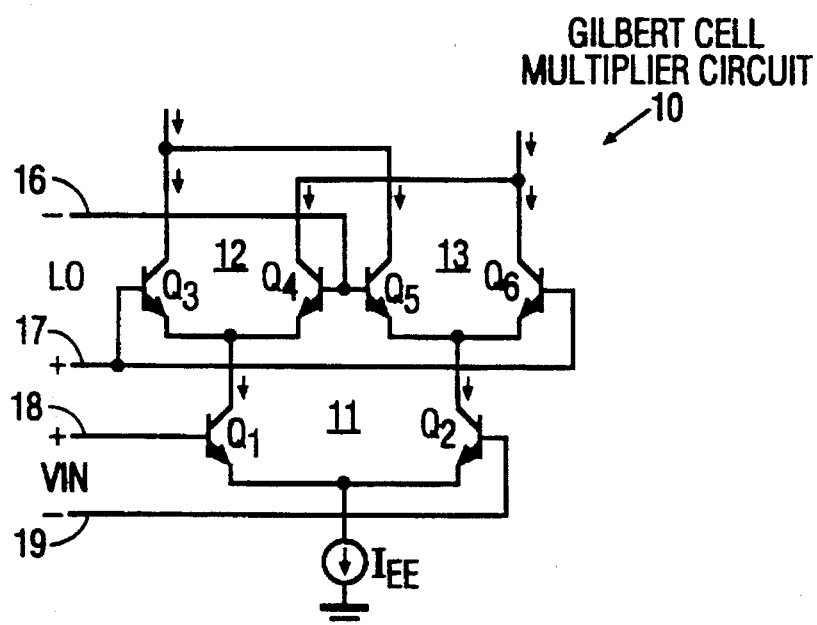
FIG. 1 is a circuit schematic of a conventional Gilbert cell multiplier.

Gilbert cell multipliers are known. See, for example, Pg. 593 of "Analog Integrated Circuits" by Gray and Meyer, published 1977 by Wiley. A Gilbert cell multiplier is a modification of an emitter-coupled cell, which allows four-quadrant multiplication in an IC balanced multiplier system. FIG. 1 shows a typical Gilbert cell multiplier circuit 10, which is characterized by the series connection of an emitter-coupled transistor pair Q1, Q2, designated 11, with two cross-coupled, emitter-coupled pairs Q3, Q4, and Q5, Q6, designated 12, and 13, respectively. Two top ports 16, 17 for LO signals and two bottom ports 18, 19 for RF signals are provided. The referenced book also provides a detailed explanation for the operation of such multipliers, which is hereby incorporated by reference, but those details need not be repeated here to understand the present invention. Note that the LO signals are applied such that the positive signal goes to both outer transistors, Q3, Q6, of each pair, and the negative signal goes to both inner transistors, Q4, Q5, of each pair.

Figure 2:
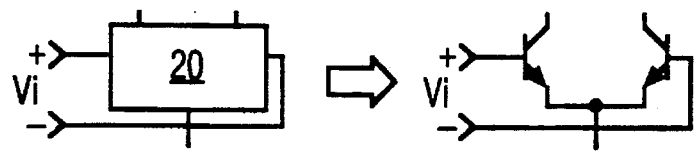
FIG. 2 is a schematic circuit showing equivalence of a differential pair.

For simplicity, each of the transistor pairs can be and are replaced by a block 20, so that the circuit fragment depicted at the left in FIG. 2 is the equivalent of the circuit fragment at the right, referred to herein as a differential pair. Thus, the block 20 corresponds to each of the transistor pairs 11, 12, and 13.

Figure 3:
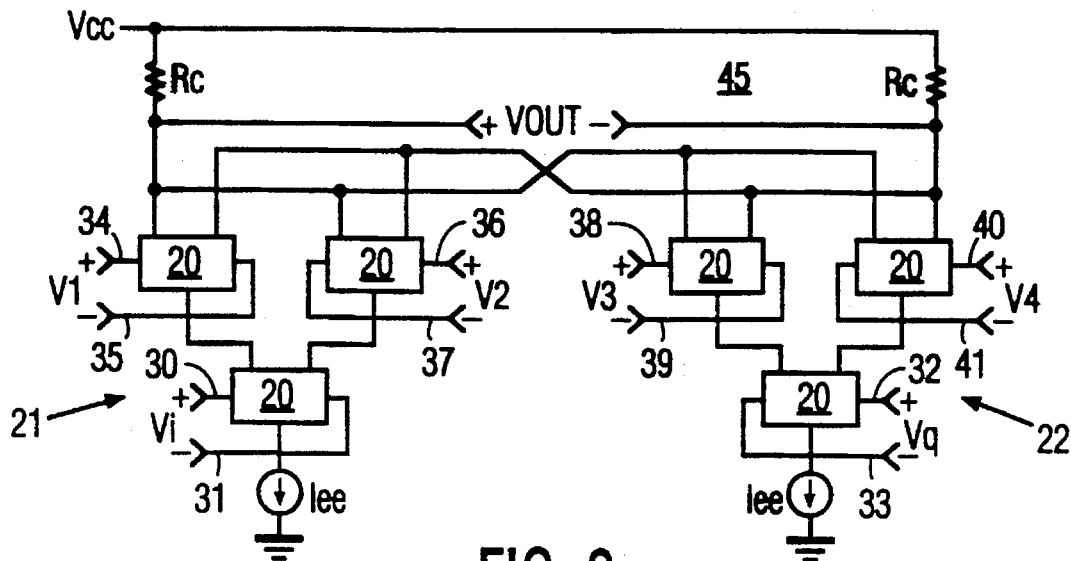
FIG. 3 is a circuit schematic of one form of quadraphase modulator circuit in accordance with the invention.

FIG. 3 shows one form of quadraphase modulator circuit in accordance with the invention, the same reference numerals designating the same elements. This differs from the circuit of FIG. 1 in that two identical Gilbert cell multipliers 21, 22 are provided, each of which, except for the signal connections, is identical to the circuit 10 of FIG. 1. In the FIG. 3 circuit, to the ports 30, 31 of the bottom differential pair at the left are supplied positive and negative I (inphase) signals, designated VI. To the ports 32, 33 of the bottom differential pair at the right are supplied positive and negative Q (quadraphase) signals, designated VQ. To the top ports 34, 35 of the left differential pair at the left are supplied positive and negative signals, designated V1. To the top ports 36, 37 of the left differential pair at the right are supplied positive and negative signals, designated V2. To the top ports 38, 39 of the right differential pair at the left are supplied positive and negative signals, designated V3. To the top ports 40, 41 of the right differential pair at the right are supplied positive and negative signals, designated V4. The circuitry 45 above the Gilbert cells provides positive and negative outputs designated Vout. This corresponds to a summation function, also described below.

In accordance with the invention, the V1, V2, V3 and V4 signals are defined as:

$$V1 = \sin\omega_1 t - (-\cos\omega_1 t) = \sin\omega_1 t + \cos\omega_1 t \qquad (1)$$

$$V2 = \cos\omega_1 t - (-\sin\omega_1 t) = \cos\omega_1 t + \sin\omega_1 t \qquad (2)$$

$$V3 = \sin\omega_1 t - \cos\omega_1 t \qquad (3)$$

$$V4 = -\cos\omega_1 t - (-\sin\omega_1 t) = \sin\omega_1 t - \cos\omega_1 t \qquad (4)$$

where $\omega_1$ is the LO frequency.

Figure 4:
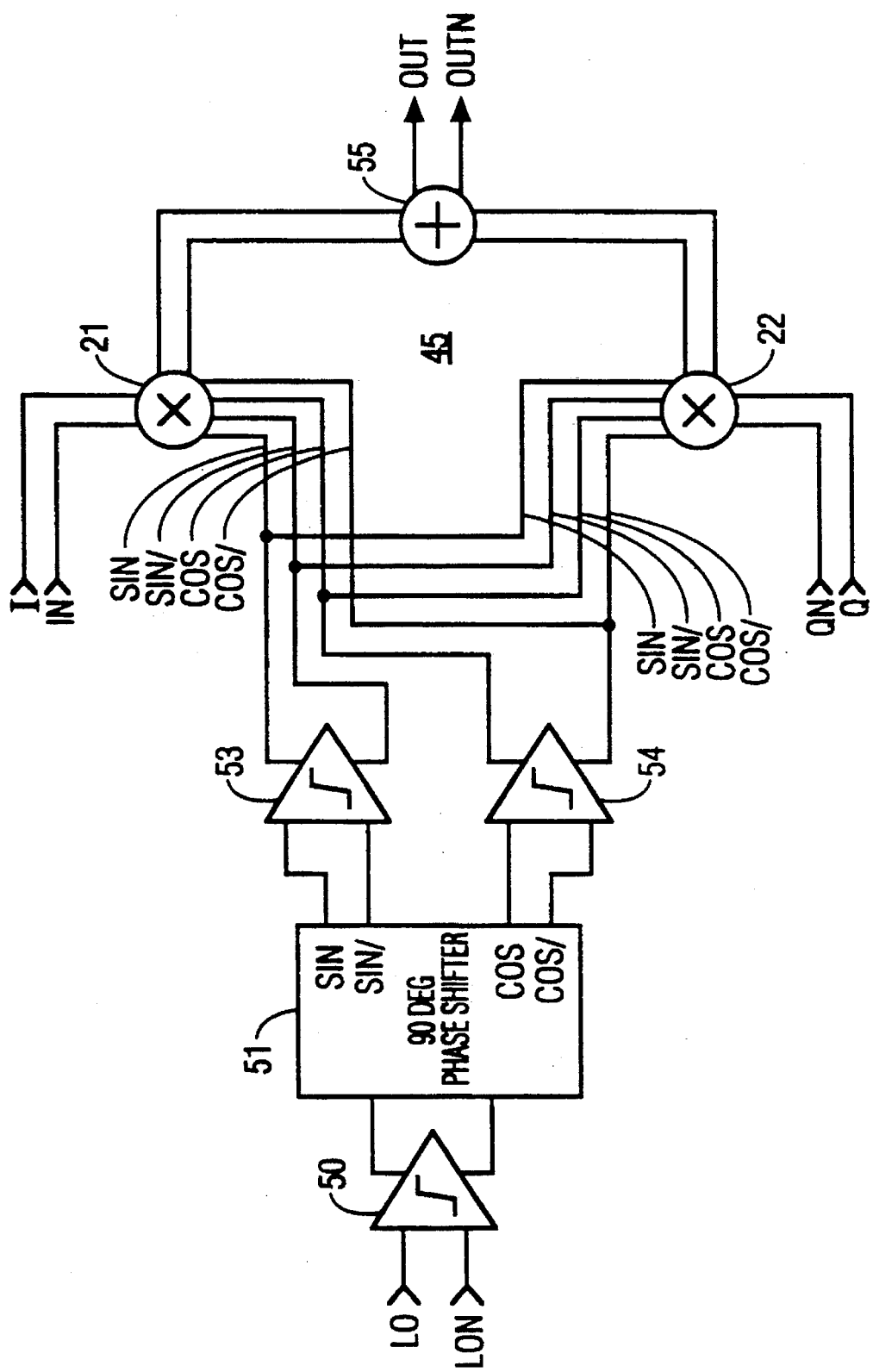
FIG. 4 is a circuit schematic of another form of quadraphase modulator circuit in accordance with the invention.

These signals are supplied as the quadrature outputs from a conventional IC phase shifter to which are input the positive and negative LO signals corresponding to those supplied to the upper ports of the Gilbert cell multiplier of FIG. 1. Equations (1) through (4) give the sum and difference terms of the quadrature LO terms. It can be demonstrated that, even though phase error terms are introduced to Eq.'s (1) through (4), the unique properties of the modulator architecture of the invention inherently corrects those errors, where the quadrature LO signals contain only phase errors. Thus, the amplitudes of the quadrature LO signals should be maintained substantially equal. This is achieved by means of limiting amplifiers which are part of the quadrature phase shift network circuitry, as shown in FIG. 4, explained below.

To explain the operation of the circuit of the invention, the modulation waveforms are examined. V1, V2, V3 and V4 are sufficiently large in amplitude ($>5V_T$) to switch the upper differential pairs of the quadraphase multipliers on/off. Due to the limiting action of V1 through V4 switching several $V_T$, the Fourier series expansion can be used on the modulation (pairs V1,V2 and V3,V4) port and on the linear port signals (differential $V_1$ and $V_Q$) of the quadraphase multiplier, assuming that V1 through V4 are large enough in amplitude to multiply the differential $V_1$ and $V_Q$ input signals by +1 and −1 alternately.

The collector currents of multiplier 21 and multiplier 22 are summed together to produce upper/lower sideband cancellation depending on the phasing (+/−180°) of the output currents.

The output of the quadraphase multiplier is $$V_{OUT} = K_3[V1(t)V_I(t)] - K_4[V3(t)V_Q(t)] \quad (5)$$

$$= K_3 \Sigma A_n \sin(n\omega_1 t + 45°)V_I(t) - \quad (6)$$

$$K_4 \Sigma A_n \sin(n\omega_1 t - 45°)V_Q(t)$$

where $$A_n = (\sin(n\pi/2))/(n\pi/4) \quad (7)$$

and $K_3=K_3=K$ is the magnitude of the gain of the multiplier from the small signal input to the output.
Let $$V_1(t) = A\sin\omega_m t \quad (8)$$

and $$V_Q(t) = A\cos\omega_m t \quad (9)$$

Substituting Eq.'s (8) and (9) into Eq. (5) yields $$V_{OUT} = K[\Sigma A_n \sin(n\omega_1 t + 45°)(A\sin\omega_m t) - A_n \sin(n\omega_1 t - 45°)(A\cos\omega_m t)] \quad (10)$$

where $$A_n = (\sin(n\pi/2))/(n\pi/4) \quad (11)$$

Applying trigonometric identities to Eq. (10) gives $$V_{OUT} = K[\Sigma(½A_n A)[\cos(n\omega_1 t + 45° - \omega_m t) - \cos(n\omega_1 t + 45° + \omega_m t)] - \Sigma(½A_n A)[\sin(n\omega_1 t - 45° + \omega_m t) + \sin(n\omega_1 t - 45° - \omega_m t)]] \quad (12)$$

Looking only at terms near $\omega_1$ (all other higher terms are filtered) yields $$V_{OUT} = ½KA_1 A[\cos(\omega_1 t + 45° - \omega_m t) - \cos(\omega_1 t + 45° + \omega_m t) - \sin(\omega_1 t - 45° + \omega_m t) - \sin(\omega_1 t - 45° - \omega_m t)] \quad (13)$$

Using $$\sin(\omega_1 t - 45° + \omega_m t) = -\cos(\omega_1 t + 45° + \omega_m t) \quad (14)$$

and $$\sin(\omega_1 t - 45° - \omega_m t) = -\cos(\omega_1 t + 45° - \omega_m t) \quad (15)$$

Substituting Eq.'s (14) and (15) into Eq. (13) produces $$V_{OUT} = ½KA_1 A[\cos(\omega_1 t + 45° - \omega_m t) - \cos(\omega_1 t + 45° + \omega_m t) + \cos(\omega_1 t + 45° + \omega_m t) + \cos(\omega_1 t + 45° - \omega_m t)] \quad (16)$$

Collecting like terms provides $$V_{OUT} = KA_1 A[\cos(\omega_1 t - \omega_m t + 45°)] \quad (17)$$

which is the lower sideband term, $\omega_1 t - \omega_m t$, as is desired and where $$A_1 = (\sin(\pi/2))/(\pi/4) = 4/\pi \quad (18)$$

and A is the input amplitude of the I and Q differential input signals and K is the small signal multiplier gain.

This demonstrates that by the unique application of quadrature LO signals to the Gilbert cell pair, even with phase errors present, complete sideband cancellation can be achieved independent of the quadrature LO phase quality. In practical applications, phase errors up to +/−10° cause no significant level of the undesired (canceled) sideband.

FIG. 4 shows one form of circuit embodying the invention. The Gilbert cell multipliers 21, 22 and their outputs 45 correspond to the FIG. 3 circuit. I and IN correspond to +VI and −VI in FIG. 3. "N" and "/" represent the opposite phase signal, sometimes shown as a bar over the symbol. Q and QN correspond to +VQ and −VQ of FIG. 3. LO and LON correspond to the normal quadrature LO signals. These input signals in FIG. 4 are amplified by a limiting amplifier 50 and inputted to a conventional 90° phase shifter 51 whose outputs, quadrature sin and sin/, and cos and cos/ signals, are again amplified in limiting amplifiers 53, 54, and supplied as inputs to the multipliers 21 and 22 as shown to correspond to the signals V1–V4 defined above. Thus, V1=sin−cos\= sin+cos; V2=cos−sin\=cos+sin; V3=sin−cos=sin−cos; V4=cos\−sin\=sin−cos. The outputs at 45 are summed in a conventional summer 55, from whose output are obtained the desired signals OUT and OUTN. Used as a modulator, the output would be the quadrature LO signals modulated by the signals VI and VQ.

It will be understood that the invention is not limited to the specific circuitry of FIG. 4, and other ways of producing the desired sum and difference, limited, quadrature differential signals to be supplied to the pair of Gilbert cell multipliers as described above are considered to be within the scope of the invention.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. An I/Q quadraphase modulator comprising:

(a) first and second multiplier means each having first, second, and third inputs and an output, (b) means for connecting an I input signal to the third input of the first multiplier means, (c) means for connecting a Q input signal to the third input of the second multiplier means, (d) four quadraphase signals V1, V2, V3, V4 having a frequency equal to $\omega_1$, where:

$$V1 = \sin\omega_1 t + \cos\omega_1 t,$$

$$V2 = \cos\omega_1 t + \sin\omega_1 t,$$

$$V3 = \sin\omega_1 t - \cos\omega_1 t,$$

$$V4 = \sin\omega_1 t - \cos\omega_1 t,$$

(e) means for supplying the signal V1 to the first input of the first multiplier means, (f) means for supplying the signal V2 to the second input of the first multiplier means, (g) means for supplying the signal V3 to the first input of the second multiplier means, (h) means for supplying the signal V4 to the second input of the second multiplier means.

2. The I/Q quadraphase modulator as claimed in claim 1, wherein the first and second multiplier means is a Gilbert cell multiplier.

3. The I/Q quadraphase modulator as claimed in claim 2, wherein each Gilbert cell multiplier comprises first and second differential pairs series-connected to a third differential pair, said first, second and third inputs being connected, respectively, to the first, second, and third differential pairs.

4. An I/Q quadraphase modulator comprising:
   (a) first and second multiplier means each having first, second, and third inputs and an output,
   (b) summation means having inputs connected to the outputs of the first multiplier means and second multiplier means and having an output,
   (c) means for connecting an I input signal to the third input of the first multiplier means,
   (d) means for connecting a Q input signal to the third input of the second multiplier means,
   (e) means for receiving and processing a local oscillator signal having a frequency equal to $\omega_1$, to produce four quadraphase signals, V1, V2, V3, V4, where:

$V1 = \sin\omega_1 t + \cos\omega_1 t,$ $V2 = \cos\omega_1 t + \sin\omega_1 t,$ $V3 = \sin\omega_1 t - \cos\omega_1 t,$ $V4 = \sin\omega_1 t - \cos\omega_1 t,$ (f) means for supplying the signal V1 to the first input of the first multiplier means,
   (g) means for supplying the signal V2 to the second input of the first multiplier means,
   (h) means for supplying the signal V3 to the first input of the second multiplier means,
   (i) means for supplying the signal V4 to the second input of the second multiplier means.

5. The I/Q quadraphase modulator as claimed in claim 4, wherein the means for receiving and processing includes means for limiting the amplitude of the local oscillator signals.

6. The I/Q quadraphase modulator as claimed in claim 5, wherein the first and second multiplier means is a Gilbert cell multiplier.

7. The I/Q quadraphase modulator as claimed in claim 6, wherein each Gilbert cell multiplier comprises first and second differential pairs series-connected to a third differential pair, said first, second and third inputs being connected, respectively, to the first, second, and third differential pairs.

8. The I/Q quadraphase modulator as claimed in claim 4, wherein the means for receiving and processing a local oscillator signal comprises a 90° phase shifter having an input coupled to said local oscillator signal and four outputs for producing said four quadraphase signals.

* * * * *